(12) United States Patent
Kim et al.

(10) Patent No.: US 10,916,545 B2
(45) Date of Patent: Feb. 9, 2021

(54) SEMICONDUCTOR DEVICE

(71) Applicant: SAMSUNG ELECTRONICS CO., LTD., Suwon-si (KR)

(72) Inventors: Hyo Jin Kim, Bucheon-si (KR); Dae Won Ha, Seoul (KR); Yoon Moon Park, Seoul (KR); Keun Hwi Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/354,369

(22) Filed: Mar. 15, 2019

(65) Prior Publication Data
US 2020/0043928 A1 Feb. 6, 2020

(30) Foreign Application Priority Data

Aug. 3, 2018 (KR) .................... 10-2018-0090715

(51) Int. Cl.
*H01L 27/092* (2006.01)
(52) U.S. Cl.
CPC ................. *H01L 27/0924* (2013.01)
(58) Field of Classification Search
CPC ................................................ H01L 27/0924
See application file for complete search history.

(56) References Cited

U.S. PATENT DOCUMENTS

| | | | |
|---|---|---|---|
| 7,465,992 B2 | 12/2008 | Desouza et al. | |
| 9,324,850 B2 | 4/2016 | Kang et al. | |
| 9,466,669 B2 | 10/2016 | Rodder et al. | |
| 9,490,258 B2 | 11/2016 | Jeong et al. | |
| 9,595,610 B2 | 3/2017 | Kwon et al. | |
| 2015/0091059 A1* | 4/2015 | Hung | H01L 29/66795 257/192 |
| 2016/0379970 A1 | 12/2016 | Kito | |
| 2017/0117411 A1* | 4/2017 | Kim | H01L 27/1116 |
| 2019/0165138 A1* | 5/2019 | Tsai | H01L 27/0924 |

* cited by examiner

*Primary Examiner* — Christine A Enad
(74) *Attorney, Agent, or Firm* — Lee IP Law, PC

(57) ABSTRACT

A semiconductor device includes a substrate having a first region and a second region, a first transistor including a single first active fin disposed in the first region, a first gate electrode intersecting the single first active fin, and a single first source/drain layer disposed in the first recess of the single first active fin, and a second transistor including a plurality of second active fins disposed in the second region, a second gate electrode intersecting the plurality of second active fins, and a plurality of second source/drain layers disposed in the second recesses of the plurality of second active fins. The single first active fin and the plurality of second active fins may have a first conductivity type, and a depth of the first recess may be less than a depth of each of the second recesses.

6 Claims, 11 Drawing Sheets

SEMICONDUCTOR DEVICE

CROSS-REFERENCE TO RELATED APPLICATION

Korean Patent Application No. 10-2018-0090715, filed on Aug. 3, 2018, in the Korean Intellectual Property Office, and entitled: "Semiconductor Device," is incorporated by reference herein in its entirety.

BACKGROUND

1. Field

Embodiments relate to a semiconductor device.

2. Description of the Related Art

As demand for high performance, high speed, and/or versatility in semiconductor devices is increased, the degree of integration of semiconductor devices is increasing. In fabricating semiconductor devices having a fine pattern, to correspond to the tendency toward high integration of semiconductor devices, patterns having fine widths or fine spacings are desired.

SUMMARY

Embodiments are directed to a semiconductor device, including a substrate having a first region and a second region, a first transistor including a single first active fin disposed in the first region, a first gate electrode intersecting the single first active fin, and a single first source/drain layer disposed in a first recess of the single first active fin, and a second transistor including a plurality of second active fins disposed in the second region, a second gate electrode intersecting the plurality of second active fins, and a plurality of second source/drain layers disposed in the second recesses of the plurality of second active fins. The single first active fin and the plurality of second active fins may have the first conductivity type, and a depth of the first recess may be less than a depth of each of the second recesses.

Embodiments are also directed to a semiconductor device, including a substrate having a first region, a second region and a third region, a first fin-type transistor disposed in the first region, and including a first active fin protruding from the substrate, a first gate electrode intersecting the first active fin, and a first source/drain layer on the first active fin at both sides of the first gate electrode, a second fin-type transistor disposed in the second region, and including two second active fins protruding from the substrate and extending in parallel, a second gate electrode intersecting the two second active fins, and second source/drain layers on the two second active fins at both sides of the second gate electrode, and a third fin-type transistor disposed in the third region, and including three third active fins protruding from the substrate and extending in parallel, a third gate electrode intersecting the three third active fins, and third source/drain layers on the three third active fins at both sides of the third gate electrode. The first source/drain layer, the second source/drain layers and the third source/drain layers may include a same semiconductor material and a same dopant, and a bottom surface of the first source/drain layer may be located on a level higher than a level of at least one of bottom surfaces of the second source/drain layers and bottom surfaces of the third source/drain layers.

Embodiments are also directed to a semiconductor device, including a substrate having a first region and a second region, a first transistor including a single first active fin disposed in the first region, a first gate electrode intersecting the single first active fin, a first recess on the single first active fin at both sides of the first gate electrode, and a first source/drain layer disposed in the first recess, a second transistor including a single second active fin disposed in the first region and having a conductivity type different from a conductivity type of the single first active fin, a second gate electrode intersecting the single second active fin, a second recess on the single second active fin at both sides of the second gate electrode, and a second source/drain layer disposed in the second recess, a third transistor including a plurality of third active fins disposed in the second region, a third gate electrode intersecting the plurality of third active fins, third recesses disposed in the plurality of third active fins at both sides of the third gate electrode, and third source/drain layers disposed in the third recesses, and a fourth transistor including a plurality of fourth active fins disposed in the second region and having a conductivity type different from a conductivity type of the plurality of third active fins, a fourth gate electrode intersecting the plurality of fourth active fins, fourth recesses disposed in the plurality of fourth active fins at both sides of the fourth gate electrode, and fourth source/drain layers disposed in the fourth recesses. A depth of the first recess may be less than a depth of each of the third recesses, a depth of the second recess may be less than a depth of each of the fourth recesses, and the depth of the first recess may be less than the depth of the second recess.

BRIEF DESCRIPTION OF THE DRAWINGS

Features will become apparent to those of skill in the art by describing in detail example embodiments with reference to the attached drawings in which.

DETAILED DESCRIPTION

Hereinafter, example embodiments will be described with reference to the accompanying drawings.

Figure 1:
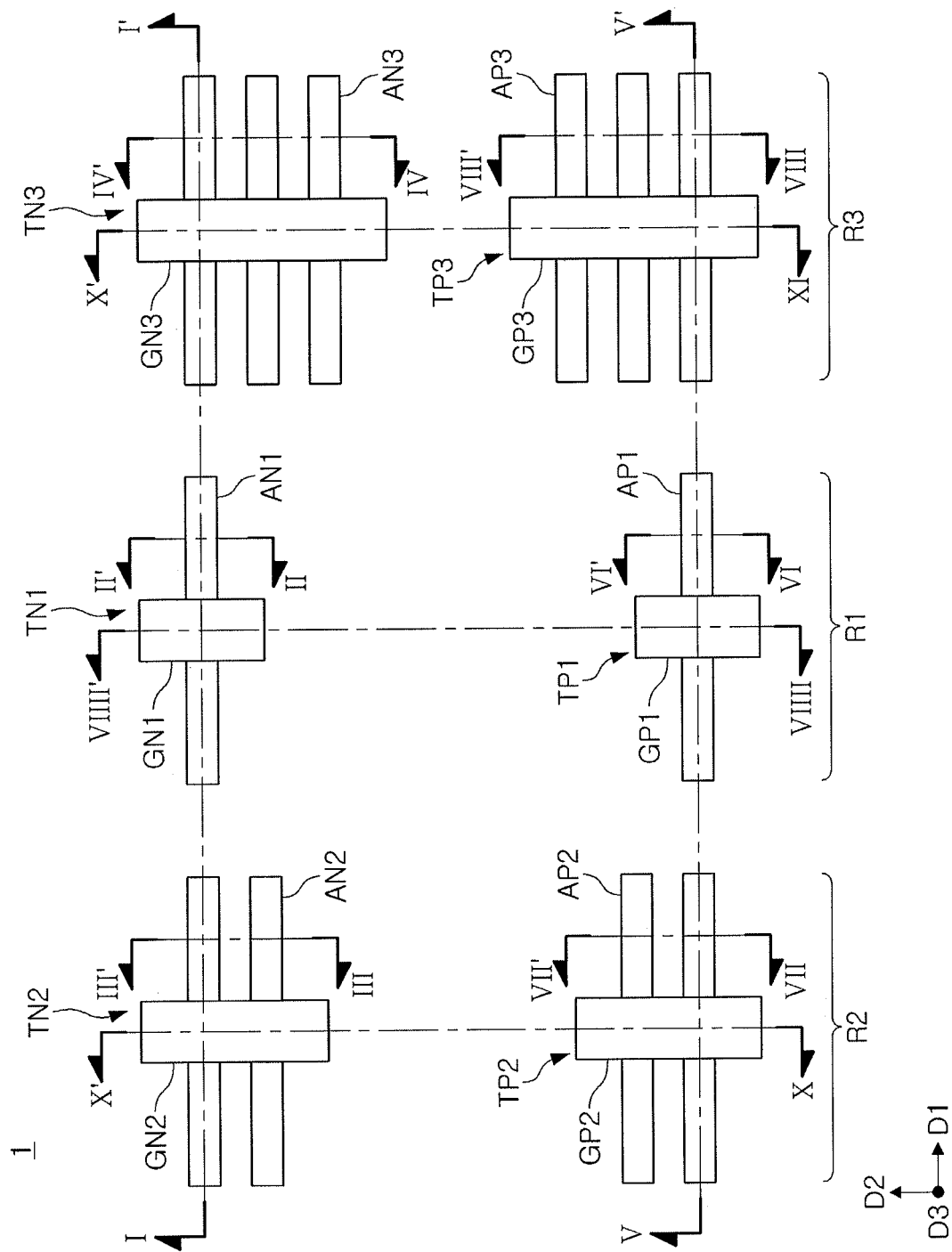
FIG. 1 illustrates a plan view of a semiconductor device according to an example embodiment.

FIG. 1 is a plan view of a semiconductor device according to an example embodiment.

Referring to FIG. 1, a semiconductor device 1 according to an example embodiment may include a first transistor TN1, a second transistor TN2, a third transistor TN3, a fourth transistor TP1, a fifth transistor TP2, and a sixth transistor TP3.

The first transistor TN1 and the fourth transistor TP1 may be disposed in a first region R1, the second transistor TN2 and the fifth transistor TP2 may be disposed in a second region R2, and the third transistor TN3 and the sixth transistor TP3 may be disposed in a third region R3.

The first to third regions R1, R2 and R3 may be regions in which amounts of current required in transistors are different. For example, the current amount of the first transistor TN1 required in the first region R1 may be lowest and the current amount of the third transistor TN3 required in the third region R3 may be highest, among the first to third regions R1, R2 and R3. The current amount of the fourth transistor TP1 required in the first region R1 may be lowest and the current amount of the sixth transistor TP3 required in the third region R3 may be highest, among the first to third regions R1, R2 and R3.

The first transistor TN1 may include a single first active fin AN1 and a first gate electrode GN1 intersecting the first active fin AN1. The first active fin AN1 may extend in a first direction D1, and the first gate electrode GN1 may extend in a second direction D2, intersecting the first direction D1. For example, the first direction D1 and the second direction D2 may intersect perpendicularly.

The second transistor TN2 may include two second active fins AN2 disposed to have a predetermined interval therebetween in the second direction D2, and a second gate electrode GN2 intersecting the second active fins AN2. The second active fins AN2 may extend in parallel in the first direction D1, and the second gate electrode GN2 may extend in the second direction D2, intersecting the first direction D1.

The third transistor TN3 may include three third active fins AN3 arranged to have a predetermined interval therebetween in the second direction D2, and a third gate electrode GN3 intersecting the third active fins AN3. The third active fins AN3 may extend in parallel in the first direction D1, and the third gate electrode GN3 may extend in the second direction D2 intersecting the first direction D1.

The fourth transistor TP1 may include a fourth active fin AP1 and a fourth gate electrode GP1 intersecting the fourth active fin AP1. The fourth active fin AP1 may extend in the first direction D1, while the first gate electrode GP1 may extend in the second direction D2 intersecting the first direction D1.

The fifth transistor TP2 may include two fifth active fins AP2 disposed to have a predetermined interval therebetween in the second direction D2, and a fifth gate electrode GP2 intersecting the fifth active fins AP2. The fifth active fins AP2 may extend in parallel in the first direction D1, and the fifth gate electrode GP2 may extend in the second direction D2 intersecting the first direction D1.

The sixth transistor TP3 may include three sixth active fins AP3 arranged to have a predetermined interval therebetween in the second direction D2, and a sixth gate electrode GP3 intersecting the sixth active fins AP3. The sixth active fins AP3 may extend in parallel in the first direction D1, and the sixth gate electrode GP3 may extend in the second direction D2 intersecting the first direction D1.

In an example embodiment, the direction in which the first to third active fins AN1, AN2, and AN3 extend and the direction in which the first to third gate electrodes GN1, GN2, and GN3 extend may be different from those shown in the drawing. The direction in which the fourth to sixth active fins AP1, AP2, and AP3 extend and the direction in which the fourth to sixth gate electrodes GP1, GP2, and GP3 extend may be different from those shown in the drawing.

Figure 2:
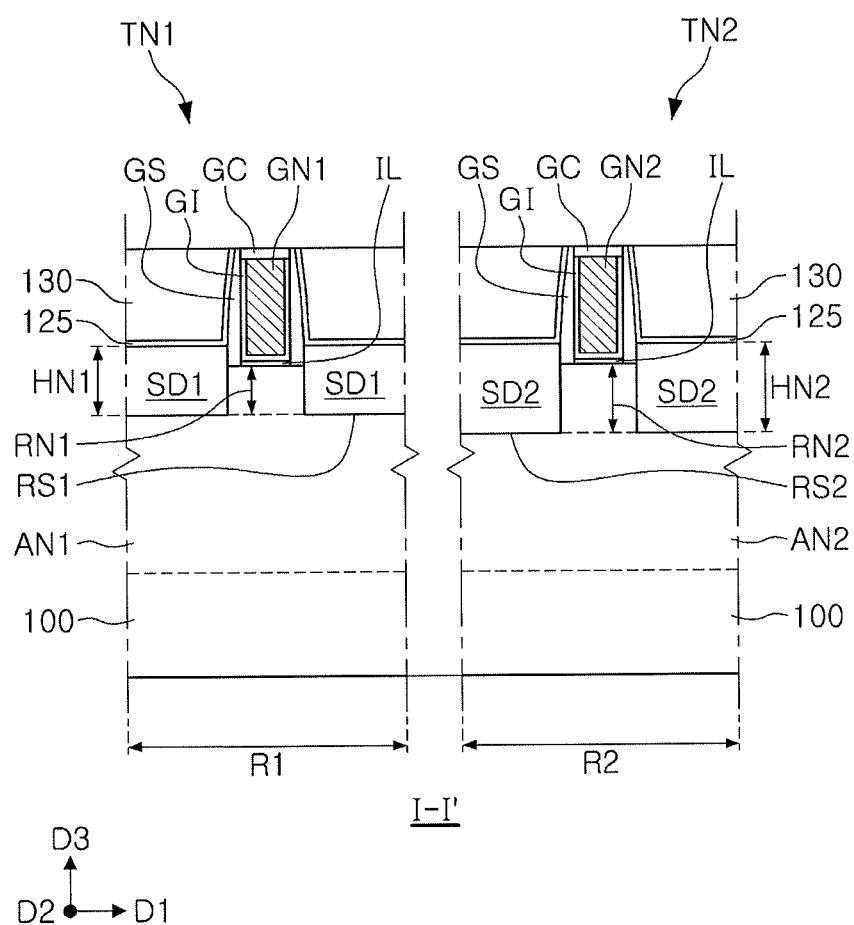
FIGS. 2 to 10 illustrate cross-sectional views of the semiconductor device of FIG. 1.
Figure 3:
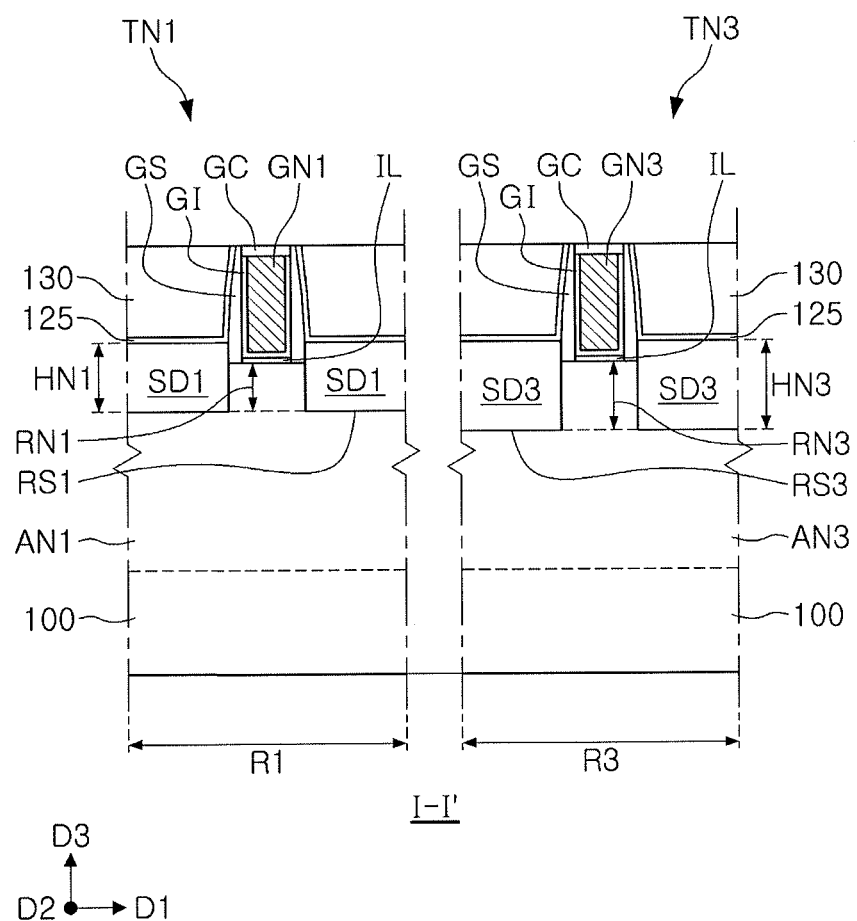

FIGS. 2 and 3 are cross-sectional views of the semiconductor device, taken along line I-I' of FIG. 1.

Referring to FIGS. 2 and 3, the semiconductor device 1 may include the first, second, and third transistors TN1, TN2, and TN3 on a substrate 100. The first, second, and third transistors TN1, TN2, and TN3 may be n-type fin field effect transistors, for example, n-type finFETs.

The semiconductor device 1 may include first, second, and third active fins AN1, AN2, and AN3, first, second, and third source/drain layers SD1, SD2, and SD3, first, second, and third gate electrodes GN1, GN2, and GN3, and a gate insulating layer GI. The semiconductor device 1 may further include an interfacial insulating layer IL, a spacer GS, a gate capping layer GC, an etch stop layer 125, and an interlayer insulating layer 130.

The substrate 100 may include a semiconductor material, such as a Group IV semiconductor, a Group III-V compound semiconductor, or a Group II-VI compound semiconductor. For example, the Group IV semiconductor may include silicon, germanium, or silicon-germanium. The substrate 100 may be a single crystal silicon substrate or a silicon-on-insulator (SOI) substrate.

The first, second, and third active fins AN1, AN2, and AN3 may protrude from the substrate 100. The first, second, and third active fins AN1, AN2, and AN3 may extend in the first direction D1. The first, second, and third active fins AN1, AN2, and AN3 may be, for example, portions of the substrate 100, or may include an epitaxial layer grown from the substrate 100. The first, second, and third active fins AN1, AN2, and AN3 may include a p-type dopant.

The first source/drain layers SD1 may be on the first active fin AN1, at both sides of the first gate electrode GN1. The first source/drain layers SD1 may be on a first recess RS1 from which a portion of the first active fin AN1 has been removed, at both sides of the first gate electrode GN1. The first source/drain layers SD1 may be grown from the first recess RS1. Upper ends of the first source/drain layers SD1 may be positioned to be higher than an upper surface of the first active fin AN1.

The second source/drain layers SD2 may be on the second active fin AN2, at both sides of the second gate electrode GN2. The second source/drain layers SD2 may be on second recesses RS2 from which a portion of the second active fin AN2 has been removed, at both sides of the second gate electrode GN2. The second source/drain layers SD2 may be grown from the second recesses RS2. Upper ends of the second source/drain layers SD2 may be positioned to be higher than an upper surface of the second active fin AN2. For example, upper ends of the first source/drain layers SD1 may be positioned on the same level as a level of upper ends of the second source/drain layers SD2.

The third source/drain layers SD3 may be on the third active fins AN3, at both sides of the third gate electrode GN3. The third source/drain layers SD3 may be on third recesses RS3 from which a portion of the third active fins AN3 has been removed, at both sides of the third gate electrode GN3. The third source/drain layers SD3 may be grown from the third recesses RS3. Upper ends of the third source/drain layers SD3 may be positioned to be higher than an upper surface of the third active fin AN3. For example, upper ends of the first source/drain layers SD1 may be positioned on the same level as a level of upper ends of the third source/drain layers SD3.

A first depth RN1 of the first recess RS1 may be shallower than a second depth RN2 of the second recess RS2. A first height HN1 of the first source/drain layers SD1 may be lower than a second height HN2 of the second source/drain layers SD2. The first depth RN1 of the first recess RS1 may be shallower than a third depth RN3 of the third recess RS3. The first height HN1 of the first source/drain layers SD1 may be lower than a third height HN3 of the third source/drain layers SD3. The second depth RN2 of the second recess RS2 may be the same as the third depth RN3 of the third recess RS3. The second height HN2 of the second source/drain layers SD2 may be equal to the third height HN3 of the third source/drain layers SD3. A contact area between the first active fin AN1 and the first source/drain layer SD1 is smaller than a contact area between each of the second active fins AN2 and each of the second source/drain layers SD2. A contact area between the first active fin AN1 and the first source/drain layer SD1 is smaller than a contact area between each of the third active fins AN3 and each of the third source/drain layers SD3.

The first to third source/drain layers SD1, SD2, and SD3 may include a material that causes tensile strain in a channel region. For example, when the substrate 100 is a silicon substrate, the first to third source/drain layers SD1, SD2, and SD3 may include a SiC layer having a smaller lattice constant than that of Si, or a Si layer having a lattice constant substantially the same as that of the substrate 100. The first to third source/drain layers SD1, SD2, and SD3 may include an n-type dopant.

The gate insulating layer GI may be disposed between the first to third active fins AN1, AN2, and AN3 and the first to third gate electrodes GN1, GN2, and GN3 and between the spacer GS and the first to third gate electrodes GN1, GN2, and GN3, respectively.

The gate insulating layer GI may include, for example, silicon oxide, silicon nitride, silicon oxynitride, or a high-k material. The high-k material may indicate a dielectric material having a dielectric constant higher than that of silicon oxide ($SiO_2$). The high-k material may be any one of, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The interfacial insulating layer IL may be disposed between the first to third active fins AN1, AN2, and AN3 and the gate insulating layer GI.

The first to third gate electrodes GN1, GN2, and GN3 may be formed of a plurality of layers stacked on the gate insulating layer GI. At least portions of the plurality of layers may be formed of different materials. The first to third gate electrodes GN1, GN2, and GN3 may include, for example, TiN, TaN, WN, WCN, TiAl, TiAlC, TiAlN, aluminum (Al), tungsten (W), molybdenum (Mo), doped polysilicon, or combinations thereof.

The spacer GS may be on sidewalls of the first to third gate electrodes GN1, GN2, and GN3. The spacer GS may respectively be in contact with portions of the first to third source/drain layers SD1, SD2, and SD3. The spacer GS may be formed of a single layer or may also be formed of several layers. The spacer GS may be formed of, for example, silicon oxide, silicon nitride, silicon oxynitride, a low-k material, or combinations thereof. The low-k material may refer to a dielectric material having a lower dielectric constant than that of silicon oxide ($SiO_2$). The low-k material may include, for example, SiCN, SiOC, SiON, SiOCN, or the like.

The etch stop layer 125 may cover the first to third source/drain layers SD1, SD2, and SD3 and the spacer GS. The interlayer insulating layer 130 may be on the etch stop layer 125. The etch stop layer 125 may include a silicon nitride film or a silicon oxynitride film. The interlayer insulating layer 130 may include a silicon oxide film.

The gate capping layer GC may be on the first to third gate electrodes GN1, GN2, and GN3. The gate capping layer GC may include, for example, one or more of silicon oxide, silicon nitride, or silicon oxynitride.

Figure 4:
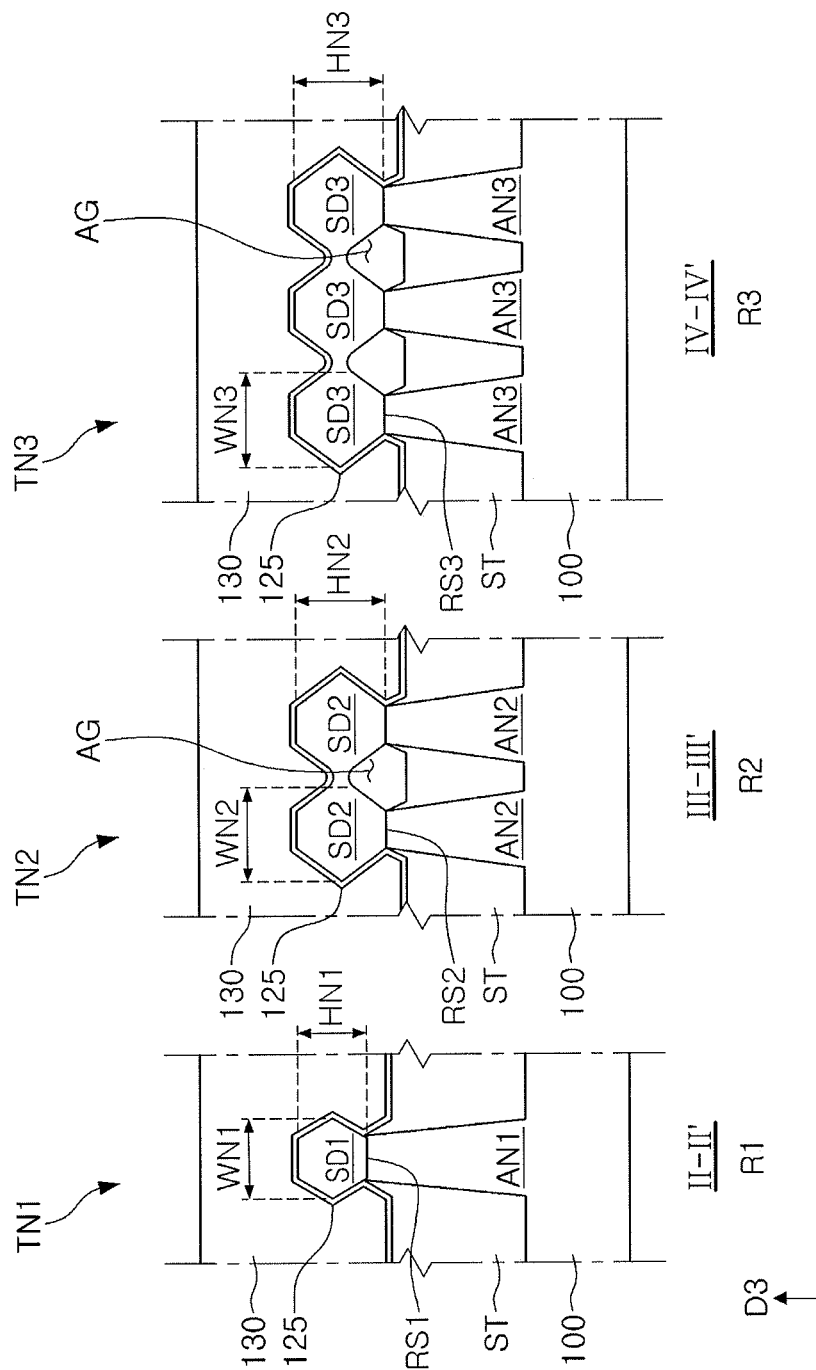

FIG. 4 provides cross-sectional views of the semiconductor device of FIG. 1, taken along lines II-II', III-III' and IV-IV'.

The first active fin AN1 and the first source/drain layer SD1 may be disposed in the first region R1. Two second active fins AN2 disposed to have a predetermined interval therebetween in the second direction D2, and two second source/drain layers SD2, may be disposed in the second region R2. Three third active fins AN3 arranged to have a predetermined interval therebetween in the second direction D2, and three third source/drain layers SD3, may be disposed in the third region R3.

The first, second, and third active fins AN1, AN2, and AN3 may protrude from the substrate 100. A device isolation layer ST may be disposed among the first, second, and third active fins AN1, AN2, and AN3, and the first, second, and third active fins AN1, AN2, and AN3 may protrude upwardly of the device isolation layer ST. The first, second, and third active fins AN1, AN2, and AN3 may have a form in which widths thereof in the second direction D2 increase toward the substrate 100. The device isolation layer ST may include, for example, a silicon oxide, a silicon nitride, a silicon oxynitride, or a combination thereof.

The first source/drain layer SD1 may be disposed in the first recess RS1 of the first active fin AN1, and may have a first width WN1 as a maximum width in the second direction D2.

The two second source/drain layers SD2 may have a connected or merged form on the second active fins AN2. The second source/drain layers SD2 may have a second width WN2 as a maximum width in the second direction D2 and may be connected to each other in such a manner that portions thereof in positions having the second width WN2 are connected to each other. An air gap AG may be formed between the second source/drain layers SD2 connected to each other and the device isolation layer ST. In another example embodiment, the two second source/drain layers SD2 may not be connected to each other. In this case, the air gap AG may not be formed.

The three third source/drain layers SD3 may have a structure in which the three third source/drain layers SD3 are connected to or merge with one another on the third active fins AN3. The third source/drain layers SD3 may have a third width WN3 as a maximum width in the second direction D2 and may be connected to each other in such a manner that portions thereof in positions having the third width WN3 are connected to each other. An air gap AG may be formed between the connected third source/drain layers SD3 and the device isolation layer ST. In another example embodiment, the three third source/drain layers SD3 may not be connected to each other. In this case, the air gap AG may not be formed.

The first width WN1 of the first source/drain layer SD1 may be less than the second width WN2 of each of the second source/drain layers SD2. The first width WN1 of the first source/drain layer SD1 may be less than the third width WN3 of each of the third source/drain layers SD3. The second width WN2 of each of the second source/drain layers SD2 and the third width WN3 of each of the third source/drain layers SD3 may be the same as each other.

Figure 5:
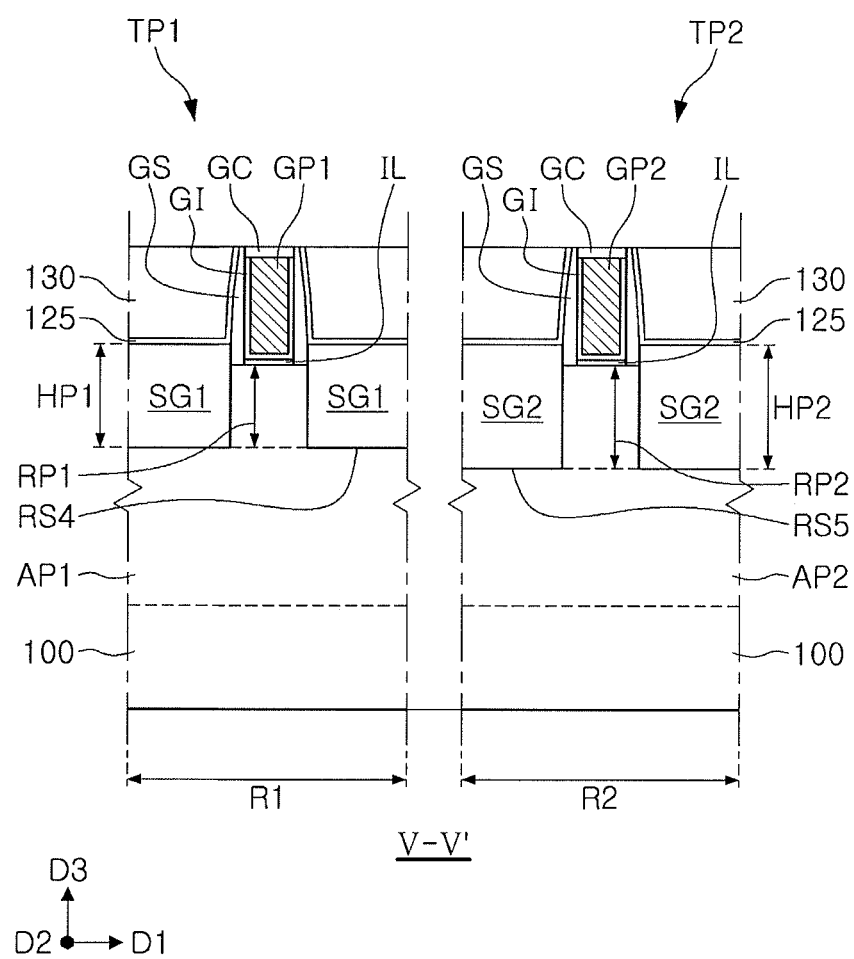
Figure 6:
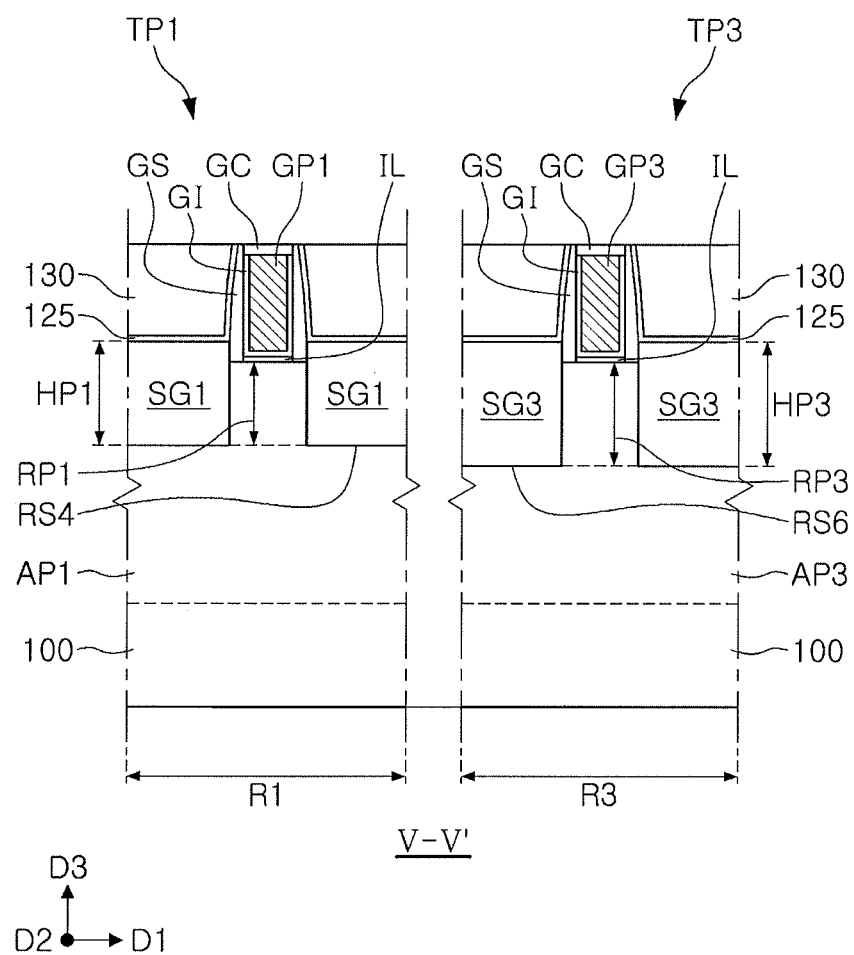

FIGS. 5 and 6 are cross-sectional views of the semiconductor device, taken along line V-V' of FIG. 1.

Referring to FIGS. 5 and 6, the semiconductor device 1 may include the fourth, fifth and sixth transistors TP1, TP2, and TP3 on the substrate 100. The fourth, fifth and sixth transistors TP1, TP2, and TP3 may be p-type fin field effect transistors, for example, p-type finFETs.

The semiconductor device 1 may include the fourth, fifth and sixth active fins AP1, AP2, and AP3, fourth, fifth and sixth source/drain layers SG1, SG2, and SG3, the fourth, fifth and sixth gate electrodes GP1, GP2, and GP3, and the gate insulating layer GI. The semiconductor device 1 may further include the interfacial insulating layer IL, the spacer GS, the gate capping layer GC, the etch stop layer 125, and the interlayer insulating layer 130.

The fourth, fifth and sixth active fins AP1, AP2, and AP3 may protrude from the substrate 100. The fourth, fifth and sixth active fins AP1, AP2, and AP3 may extend in the first direction D1. The fourth, fifth and sixth active fins AP1, AP2, and AP3 may be, for example, portions of the substrate 100, or may be formed to include an epitaxial layer grown from the substrate 100.

The fourth source/drain layers SG1 may be on the fourth active fin AP1, at both sides of the fourth gate electrode GP1. The fourth source/drain layers SG1 may be on a fourth recess RS4 from which a portion of the fourth active fin AP1 has been removed, at both sides of the fourth gate electrode GP1. The fourth source/drain layers SG1 may be grown from the fourth recess RS4. Upper ends of the fourth source/drain layers SG1 may be positioned to be higher than an upper surface of the fourth active fin AP1.

The fifth source/drain layers SG2 may be on the fifth active fin AP2, at both sides of the fifth gate electrode GP2. The fifth source/drain layers SG2 may be on fifth recesses RS5 from which a portion of the fifth active fin AP2 has been removed, st both sides of the fifth gate electrode GP2. The fifth source/drain layers SG2 may be grown from the fifth recesses RS5. Upper ends of the fifth source/drain layers SG2 may be located to be higher than an upper surface of the fifth active fin AP2. For example, upper ends of the fourth source/drain layers SG1 may be positioned on the same level as a level of upper ends of the fifth source/drain layers SG2.

The sixth source/drain layers SG3 may be on the sixth active fin AP3, at both sides of the sixth gate electrode GP3. The sixth source/drain layers SG3 may be on sixth recesses RS6 from which a portion of the sixth active fin AP3 has been removed, at both sides of the sixth gate electrode GP3. The sixth source/drain layers SG3 may be grown from the sixth recesses RS6. Upper ends of the sixth source/drain layers SG3 may be located to be higher than an upper surface of the sixth active fin AP3. For example, upper ends of the fourth source/drain layers SG1 may be positioned on the same level as a level of upper ends of the sixth source/drain layers SG3.

A fourth depth RP1 of the fourth recess RS4 may be shallower than a fifth depth RP2 of the fifth recess RS5. A fourth height HP1 of the fourth source/drain layers SG1 may be lower than a fifth height HP2 of the fifth source/drain layers SG2. The fourth depth RP1 of the fourth recess RS4 may be shallower than a sixth depth RP3 of the sixth recess RS6. The fourth height HP1 of the fourth source/drain layers SG1 may be lower than a sixth height HP3 of the sixth source/drain layers SG3. The fifth depth RP2 of the fifth recess RS5 may be the same as the sixth depth RP3 of the sixth recess RS6. The fifth height HP2 of the fifth source/drain layers SG2 may be the same as the sixth height HP3 of the sixth source/drain layers SG3. In an example embodiment, a contact area between the fourth active fin AP1 and the fourth source/drain layer SG1 is smaller than a contact area between each of the fifth active fins AP2 and each of the fifth source/drain layers SG2. In an example embodiment, a contact area between the fourth active fin AP1 and the fourth source/drain layer SG1 is smaller than a contact area between each of the sixth active fins AP3 and each of the sixth source/drain layers SG3.

The depth RN1 of the first recess RS1 may be shallower than the depth RP1 of the fourth recess RS4. The height HN1 of the first source/drain layers SD1 may be lower than the height HP1 of the fourth source/drain layers SG1. The depth RN2 of the second recess RS2 may be shallower than the depth RP2 of the fifth recess RS5. The height HN2 of the second source/drain layers SD2 may be lower than the height HP2 of the fifth source/drain layers SG2.

The fourth to sixth source/drain layers SG1, SG2, and SG3 may include a material causing a compressive strain in the channel region. For example, when the substrate 100 is a silicon substrate, the fourth to sixth source/drain layers SG1, SG2, and SG3 may include a SiGe layer having a higher lattice constant than that of silicon (Si). The fourth to sixth source/drain layers SG1, SG2, and SG3 may include a p-type dopant.

The gate insulating layer GI may be disposed between the fourth to sixth active fins AP1, AP2, and AP3 and the fourth to sixth gate electrodes GP1, GP2, and GP3 and between the spacer GS and the fourth to sixth gate electrodes GP1, GP2, and GP3.

The gate insulating layer GI may include silicon oxide, silicon nitride, silicon oxynitride or a high-k material. The high-k material may indicate a dielectric material having a dielectric constant higher than that of silicon oxide ($SiO_2$).

The interfacial insulating layer IL may be disposed between the fourth to sixth active fins AP1, AP2, and AP3 and the gate insulating layer GI.

The fourth to sixth gate electrodes GP1, GP2, and GP3 may be formed of a plurality of layers stacked on the gate insulating layer GI. At least portions of the plurality of layers may be formed of different materials. The fourth to sixth gate electrodes GP1, GP2, and GP3 may include, for example, TiN, TaN, WN, WCN, TiAl, TiAlC, TiAlN, aluminum (Al), tungsten (W), molybdenum (Mo), doped polysilicon, or combinations thereof.

The spacer GS may be on sidewalls of the fourth to sixth gate electrodes GP1, GP2, and GP3. The spacer GS may be in contact with portions of the fourth to sixth source/drain layers SG1, SG2, and SG3. The spacer GS may be composed of a single layer or several layers. The low-k material may refer to a dielectric material having a lower dielectric constant than that of silicon oxide ($SiO_2$).

The etch stop layer 125 may cover the fourth to sixth source/drain layers SG1, SG2, and SG3 and the spacer GS. The interlayer insulating layer 130 may be on the etch stop layer 125.

The gate capping layer GC may be on the fourth to sixth gate electrodes GP1, GP2, and GP3.

Figure 7:
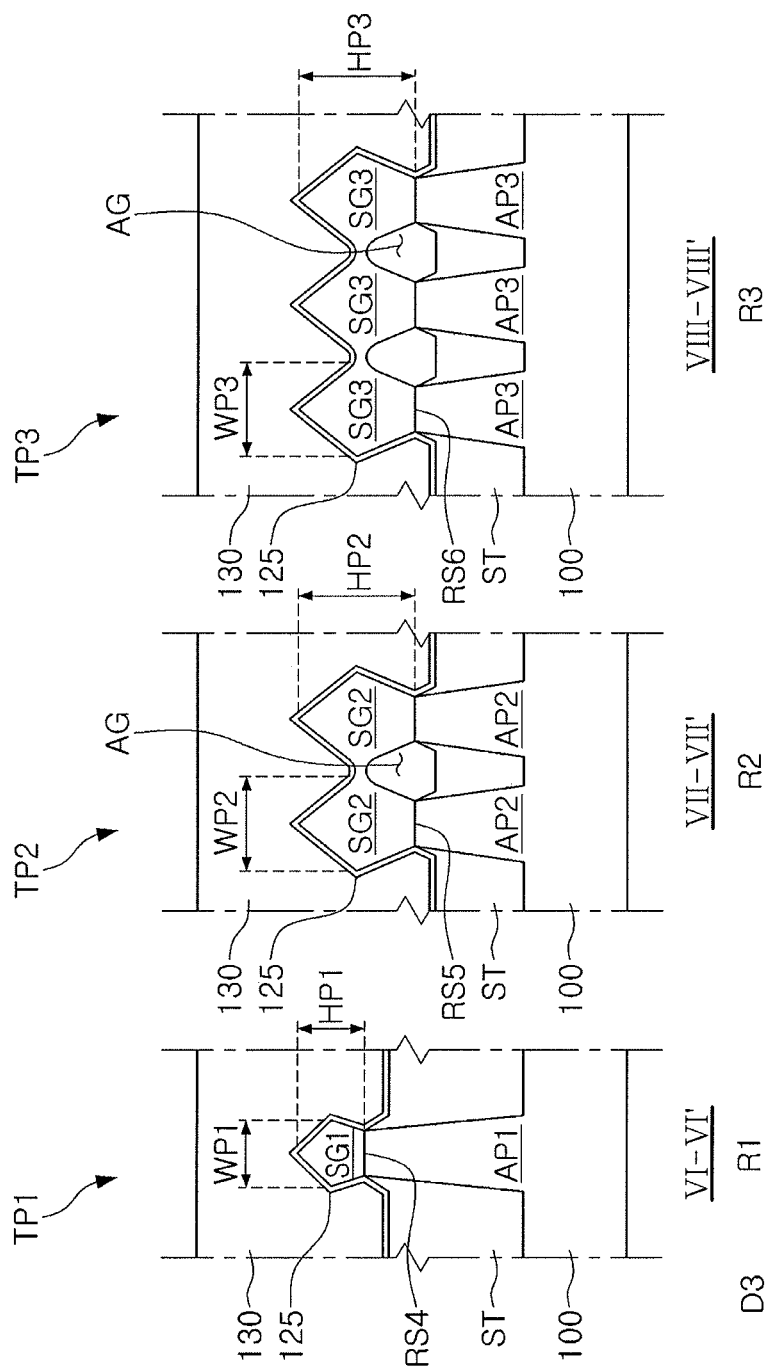

FIG. 7 is cross-sectional views of the semiconductor device, taken along lines VI-VI', VII-VII' and VIII-VIII' of FIG. 1.

The fourth active fin AP1 and the fourth source/drain layer SG1 may be disposed in the first region R1. Two fifth active fins AP2 disposed to have a predetermined interval therebetween in the second direction D2, and two fifth source/drain layers SG2, may be disposed in the second region R2. Three sixth active fins AP3 arranged to have a predetermined interval therebetween in the second direction D2, and three sixth source/drain layers SG3, may be disposed in the third region R3.

The fourth, fifth and sixth active fins AP1, AP2, and AP3 may protrude from the substrate 100. The device isolation layer ST may be disposed between the fourth, fifth and sixth active fins AP1, AP2, and AP3, and the fourth, fifth and sixth active fins AP1, AP2, and AP3 may protrude upwardly of the device isolation layer ST. The fourth, fifth and sixth active fins AP1, AP2, and AP3 may have a width in the second direction D2 that increases toward the substrate 100. The device isolation layer ST may include, for example, a silicon oxide, a silicon nitride, a silicon oxynitride, or combinations thereof.

The fourth source/drain layer SG1 may be on the fourth recess RS4 of the fourth active fins AP1, and may have a fourth width WP1 as a maximum width in the second direction D2.

Two fifth source/drain layers SG2 may have a structure in which the fifth source/drain layers are connected to or merge with each other on two fifth active fins AP2. The fifth source/drain layers SG2 may have a fifth width WP2 as a maximum width in the second direction D2 and may be connected to each other in such a manner that portions thereof in positions having the fifth width WP2 are connected to each other. An air gap AG may be formed between the connected fifth source/drain layers SG2 and the device isolation layer ST.

The three sixth source/drain layers SG3 may have a structure in which the three sixth source/drain layers are connected to or merge with each other on the three sixth active fins AP3. The sixth source/drain layers SG3 may have a sixth width WP3 as a maximum width in the second direction D2 and may be connected to each other in such a manner that portions thereof in positions having the sixth width WP3 are connected to each other. An air gap AG may be formed between the connected sixth source/drain layers SG3 and the device isolation layer ST.

The fourth width WP1 of the fourth source/drain layer SG1 may be less than the fifth width WP2 of each of the fifth source/drain layers SG2. The fourth width WP1 of the fourth source/drain layer SG1 may be less than the sixth width WP3 of each of the sixth source/drain layers SG3. The fifth width WP2 of the fifth source/drain layers SG2 and the sixth width WP3 of the sixth source/drain layers SG3 may be the same as each other.

In the case of the semiconductor device 1 described above, the first depth RN1 of the first recess RS1 of the first transistor TN1 may be less than the second depth RN2 of the second recess RS2 of the second transistor TN2, and the fourth depth RP1 of the fourth recess RS4 of the fourth transistor TP1 may be less than the fifth depth RP2 of the fifth recess RS5 of the fifth transistor TP2. The first height HN1 and the first width WN1 of the first source/drain layer SD1 may be less than the second height HN2 and the second width WN2 of the second source/drain layer SD2, respectively, and the fourth height HP1 and the fourth width WP1 of the fourth source/drain layer SG1 may be less than the fifth height HP2 and the fifth width WP2 of the fifth source/drain layer SG2, In a manner different therefrom, in the case of the semiconductor device 1 according to another example embodiment, the first depth RN1 of, the first recess RS1 of the first transistor TN1 may be the same as the second depth RN2 of the second recess RS2 of the second transistor TN2, and the fourth depth RP1 of the fourth recess RS4 of the fourth transistor TP1 may be less than the fifth depth RP2 of the fifth recess RS5 of the fifth transistor TP2. The first height HN1 and the first width WN1 of the first source/drain layer SD1 may be the same as the second height HN2 and the second width WN2 of the second source/drain layer SD2, respectively, and the fourth height HP1 and the fourth width WP1 of the fourth source/drain layer SG1 may be less than the fifth height HP2 and the fifth width HP2 of the fifth source/drain layer SG2, respectively.

Differently therefrom, in the case of the semiconductor device 1 according to another example embodiment, the first depth RN1 of the first recess RS1 of the first transistor TN1 may be less than the second depth RN2 of the second recess RS2 of the second transistor TN2, and the fourth depth RP1 of the fourth recess RS4 of the fourth transistor TP1 may be the same as the fifth depth RP2 of the fifth recess RS5 of the fifth transistor TP2. The first height HN1 and the first width WN1 of the first source/drain layer SD1 may be less than the second height HN2 and the second width WN2 of the second source/drain layer SD2, respectively, and the fourth height HP1 and the fourth width WP1 of the fourth source/drain layer SG1 may be the same as the fifth height HP2 and the fifth width WP2 of the fifth source/drain layer SG2, respectively.

Figure 8:
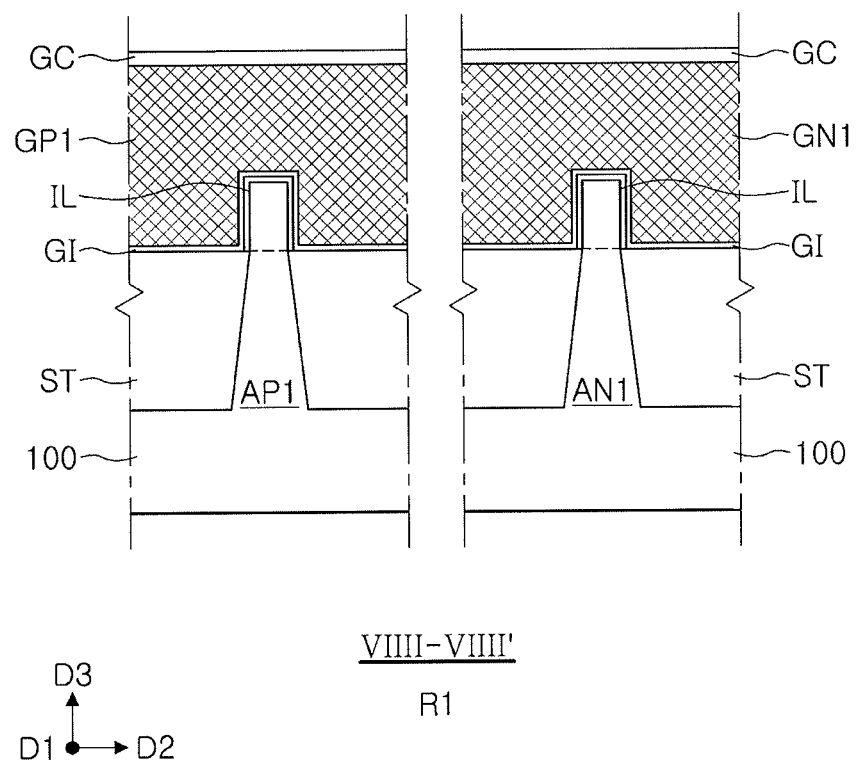
Figure 9:
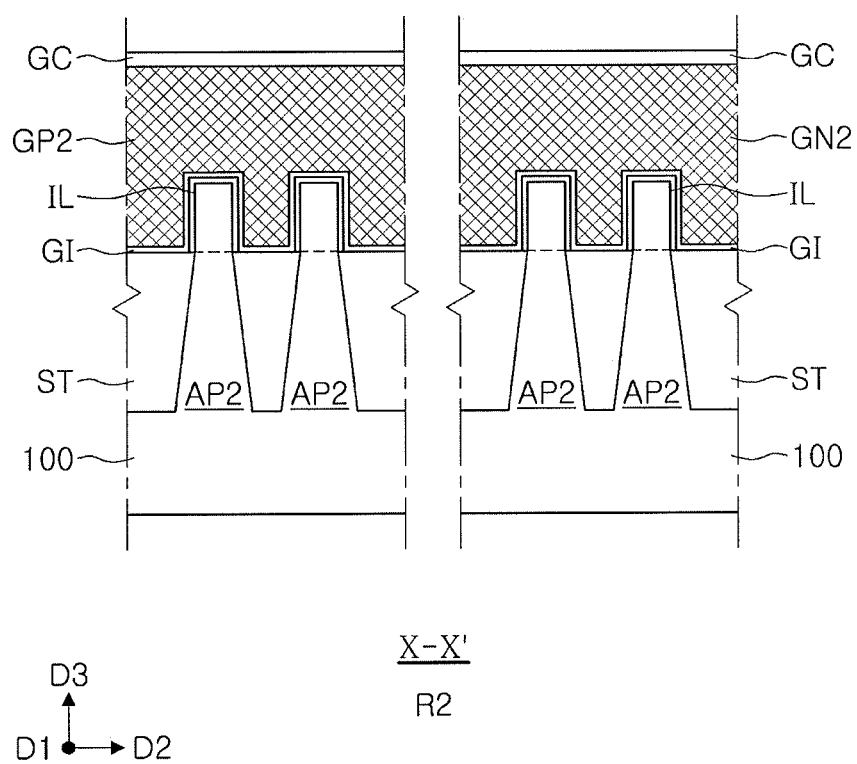
Figure 10:
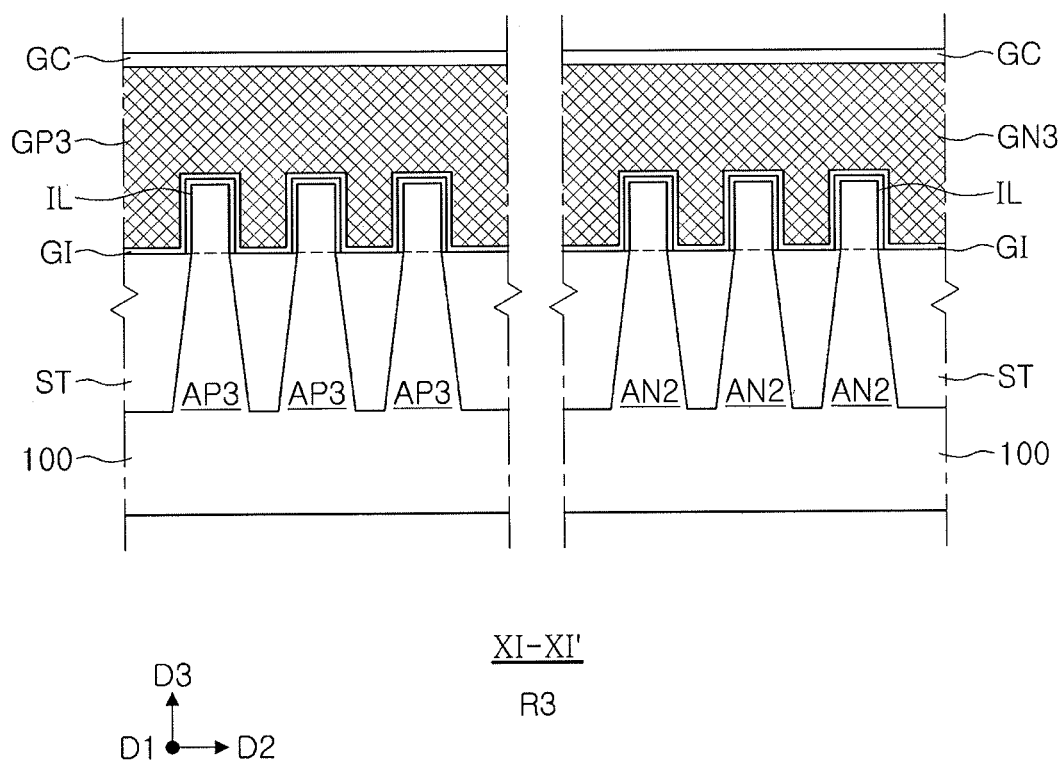

FIGS. 8 to 10 are cross-sectional views of the semiconductor device, taken along lines VIIII-VIIII', X-X' and XI-XI'.

Referring to FIG. 8, an upper portion of the first active fin AN1 may protrude upwardly of the device isolation layer ST, and the first gate electrode GN1 and the gate insulating layer GI may extend in the second direction D2, while surrounding the protruding upper portion of the first active fin AN1. The interfacial insulating layer IL may be disposed between the upper portion of the first active fin AN1 and the gate insulating layer GI. An upper portion of the fourth active fin AP1 may protrude upwardly of the device isolation layer ST, and the fourth gate electrode GP1 and the gate insulating layer GI may extend in the second direction D2, while surrounding the protruding upper portion of the fourth active fin AP1. The interfacial insulating layer IL may be disposed between the upper portion of the fourth active fin AP1 and the gate insulating layer GI.

Referring to FIG. 9, upper portions of two second active fins AN2 arranged in the second direction D2 may protrude upwardly of the device isolation layer ST, and the second gate electrode GN2 and the gate insulating layer GI may extend in the second direction D2, while surrounding the protruding upper portions of the second active fins AN2. The interfacial insulating layer IL may be disposed between the upper portions of the second active fins AN2 and the gate insulating layer GI. Upper portions of two fifth active fins AP2 arranged in the second direction D2 may protrude upwardly of the device isolation layer ST, and the fifth gate electrode GP2 and the gate insulating layer GI may extend in the second direction D2, while surrounding the protruding upper portions of the fifth active fins AP2. The interfacial insulating layer IL may be disposed between the upper portions of the fifth active fins AP2 and the gate insulating layer GI.

Referring to FIG. 10, upper portions of three third active fins AN3 arranged in the second direction D2 may protrude upwardly of the device isolation layer ST, and the third gate electrode GN3 and the gate insulating layer GI may extend in the second direction D2, while surrounding the protruding upper portions of the third active fins AN3. The interfacial insulating layer IL may be disposed between the upper portions of the third active fins AN3 and the gate insulating layer GI. Upper portions of three sixth active fins AP3 arranged in the second direction D2 may protrude upwardly of the device isolation layer ST, and the sixth gate electrode GP3 and the gate insulating layer GI may extend in the second direction D2, while surrounding the protruding upper portions of the sixth active fins AP3. The interfacial insulating layer IL may be disposed between the upper portions of the sixth active fins AP3 and the gate insulating layer GI.

Referring to FIGS. 8 to 10, the gate capping layer GC may be on the first, second, and third gate electrodes GN1, GN2, and GN3 and on the fourth, fifth and sixth gate electrodes GP1, GP2, and GP3.

Figure 11:
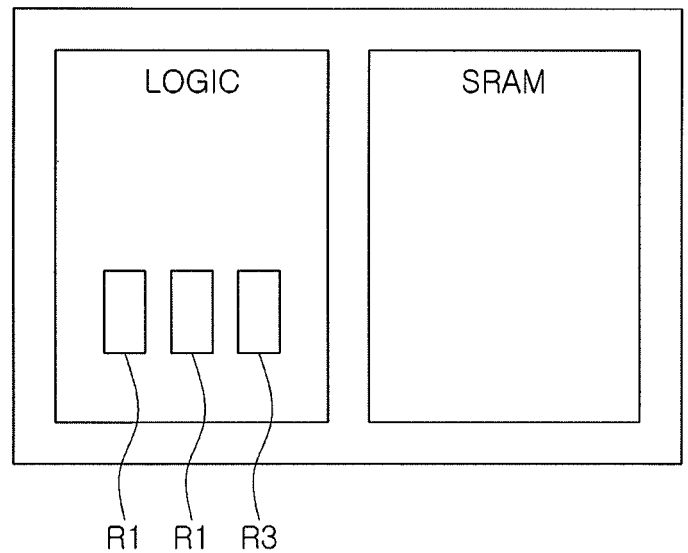
FIGS. 11 and 12 illustrate diagrams of semiconductor devices according to example embodiments.
Figure 12:
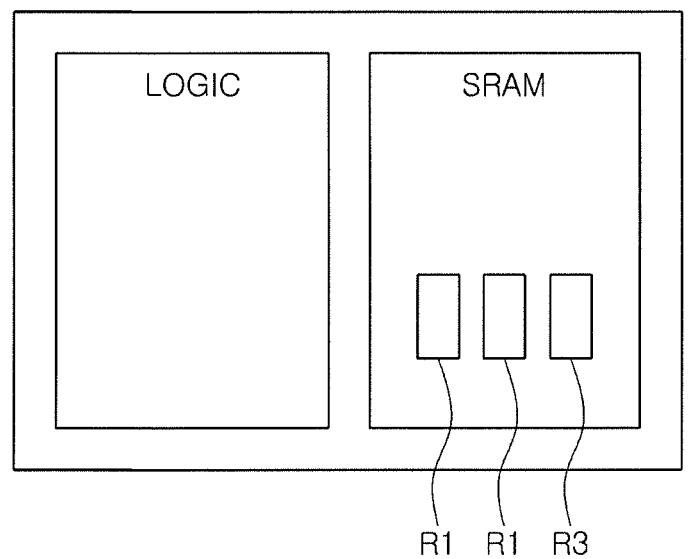

FIGS. 11 and 12 are diagrams of semiconductor devices according to example embodiments.

Referring to FIGS. 11 and 12, s semiconductor device 10 may include a logic region and an SRAM region.

Referring to FIG. 11, the logic region may include a first region R1, a second region R2, and a third region R3. The first region R1, the second region R2, and the third region R3 may be the same as those described above with reference to FIGS. 1 to 10.

Referring to FIG. 12, the SRAM region may include a first region R1, a second region R2, and a third region R3. The first region R1, the second region R2, and the third region R3 may be the same as those described above with reference to FIGS. 1 to 10.

By way of summation and review, to enhance device characteristics of planar metal oxide semiconductor FETs (MOSFETs), efforts are being made to develop a semiconductor device including a FinFET having a three-dimensional structure channel.

As described above, embodiments may reduce a short channel effect in a single fin transistors, and a threshold voltage variation therein may be improved. Embodiments may provide a semiconductor device having excellent performance.

While example embodiments have been shown and described above, it will be apparent to those skilled in the art that modifications and variations could be made without departing from the scope of the present inventive concept as defined by the appended claims.

What is claimed is:

1. A semiconductor device, comprising:
a substrate having a first region, a second region, and a third region;
a first fin-type transistor disposed in the first region, and including a first active fin protruding from the substrate, a first gate electrode intersecting the first active fin, and a first source/drain layer on the first active fin at both sides of the first gate electrode;
a second fin-type transistor disposed in the second region, and including two second active fins protruding from the substrate and extending in parallel, a second gate electrode intersecting the two second active fins, and second source/drain layers on the two second active fins at both sides of the second gate electrode; and
a third fin-type transistor disposed in the third region, and including three third active fins protruding from the substrate and extending in parallel, a third gate electrode intersecting the three third active fins, and third source/drain layers on the three third active fins at both sides of the third gate electrode,
wherein the first source/drain layer, the second source/drain layers, and the third source/drain layers include a same semiconductor material and a same dopant, and a bottom surface of the first source/drain layer is located on a level higher than a level of at least one of bottom surfaces of the second source/drain layers and bottom surfaces of the third source/drain layers.

2. The semiconductor device as claimed in 1, wherein the bottom surfaces of the second source/drain layers are located on the same level as the bottom surfaces of the third source/drain layers.

3. The semiconductor device as claimed in 1, wherein a height of the first source/drain layer is less than a height of the second source/drain layers and a height of the third source/drain layers.

4. The semiconductor device as claimed in 3, wherein the second source/drain layers have a height equal to a height of each of the third source/drain layers.

5. The semiconductor device as claimed in 1, wherein a width of the first source/drain layer in a direction in which the first gate electrode extends is less than a width of each of the second source/drain layers in a direction in which the second gate electrode extends.

6. The semiconductor device as claimed in 5, wherein the width of each of the second source/drain layers in the direction in which the second gate electrode extends is equal to a width of each of the third source/drain layers in a direction in which the third gate electrode extends.

* * * * *